(12) United States Patent
Fink

(10) Patent No.: US 7,604,701 B2
(45) Date of Patent: Oct. 20, 2009

(54) METHOD AND APPARATUS FOR REMOVING EXTERNAL COMPONENTS FROM A PROCESS CHAMBER WITHOUT COMPROMISING PROCESS VACUUM

(75) Inventor: Steven T Fink, Mesa, AZ (US)

(73) Assignee: Tokyo Electron Limited (JP)

( * ) Notice: Subject to any disclaimer, the term of this patent is extended or adjusted under 35 U.S.C. 154(b) by 264 days.

(21) Appl. No.: 10/872,569

(22) Filed: Jun. 22, 2004

(65) Prior Publication Data

US 2005/0011446 A1    Jan. 20, 2005

Related U.S. Application Data

(60) Provisional application No. 60/486,459, filed on Jul. 14, 2003.

(51) Int. Cl.
*C23C 16/00*    (2006.01)
*H01L 21/306*    (2006.01)

(52) U.S. Cl. ..................................................... 118/733

(58) Field of Classification Search . 156/345.1–345.55; 118/715–733
See application file for complete search history.

(56) References Cited

U.S. PATENT DOCUMENTS

| | | | | |
|---|---|---|---|---|
| 4,809,862 A | * | 3/1989 | Canty | 220/663 |
| 5,141,125 A | * | 8/1992 | Canty et al. | 220/820 |
| 6,306,246 B1 | * | 10/2001 | Melvin et al. | 156/345.25 |
| 6,367,415 B2 | * | 4/2002 | Kim et al. | 118/723 E |
| 6,390,019 B1 | * | 5/2002 | Grimbergen et al. | 118/723 R |
| 2005/0150455 A1 | * | 7/2005 | Kobayashi et al. | 118/715 |

FOREIGN PATENT DOCUMENTS

| | | | |
|---|---|---|---|
| WO | WO 0113419 A1 | * | 2/2001 |
| WO | WO 2004/026096 A2 | | 4/2004 |
| WO | WO 2004/032177 A2 | | 4/2004 |
| WO | WO 2004/032178 A2 | | 4/2004 |

* cited by examiner

*Primary Examiner*—Karla Moore

(57) ABSTRACT

An access assembly for a process chamber, including a wall segment constructed and arranged to access the process chamber, a mounting assembly constructed and arranged to couple the wall segment to the process chamber, and a sealing plate mounted to the process chamber. The sealing plate is constructed and arranged to isolate the wall segment from a volume inside the process chamber.

34 Claims, 11 Drawing Sheets

US 7,604,701 B2

1

METHOD AND APPARATUS FOR REMOVING EXTERNAL COMPONENTS FROM A PROCESS CHAMBER WITHOUT COMPROMISING PROCESS VACUUM

CROSS REFERENCE TO RELATED APPLICATIONS

This is a non-provisional application which relies upon, and claims the priority of, the filing date of U.S. Provisional Application No. 60/486,459, filed on Jul. 14, 2003, the contents of which are incorporated herein in their entirety by reference.

FIELD OF THE INVENTION

The present invention pertains to vacuum systems in general and in particular to an apparatus and a method for selectively isolating a segment of a wall of a process chamber, and for removing the segment from the process chamber without compromising a vacuum in the process chamber.

BACKGROUND OF THE INVENTION

Plasma processing systems are used in the manufacture and processing of semiconductors, integrated circuits, displays and other devices and materials, to remove material from or to deposit material on a substrate such as a semiconductor substrate. In some instances, these plasma processing systems use electrodes for providing RF energy to a plasma useful for depositing on or removing material from a substrate.

There are several different kinds of plasma processes used during wafer or substrate processing. These processes include, for example: plasma etching, plasma deposition, plasma assisted photoresist stripping and in-situ plasma chamber cleaning.

In plasma reactors, various instruments are used to determine the plasma condition. Some instruments are designed to take measurements directly in the process plasma while other instruments take measurements through appropriate windows. Regardless of the measuring instrument or the specific measuring method used or whether or not windows are utilized, interfaces to the process chamber should remain relatively clean. Otherwise, data gathered by observation or experimentation can be inaccurate.

In a conventional plasma reactor, a formation of a film consisting of adsorbed chemical species present in the processing plasma can adhere to a window. During substrate or wafer processing, the film grows on the window leading to a gradual deterioration of the measurement signal (which can be, for example, an optical signal). This can lead to non-repeatability and non-accuracy of signal measurements made under the same conditions and thus can affect processing tool control systems that base their action on signal input from diagnostic sensors (e.g. optical diagnostics sensors). Therefore, it becomes necessary to clean the window or other interface of accumulated or deposited materials.

BRIEF SUMMARY OF THE INVENTION

An aspect of the present invention is to provide an access assembly for a process chamber including a segment of a wall of the process chamber, a mounting assembly constructed and arranged to couple the segment to the process chamber, and a sealing plate mounted to the process chamber. The sealing plate is constructed and arranged to selectively isolate the segment from a volume inside the process chamber.

Another aspect of the invention is to provide a method for removing and mounting a segment of a wall of a process chamber in an access assembly, the access assembly including a mounting assembly for coupling the segment to the process chamber, and a sealing plate mounted to the process chamber, the method comprising closing the sealing plate to isolate the wall segment from a volume inside the process chamber, removing the segment, mounting and sealing the segment to the process chamber, and opening the sealing plate.

BRIEF DESCRIPTION OF THE DRAWINGS

A detailed description of the invention is given below with reference to the accompanying drawings, of which.

DETAILED DESCRIPTION OF EMBODIMENTS OF THE INVENTION

Figure 1:
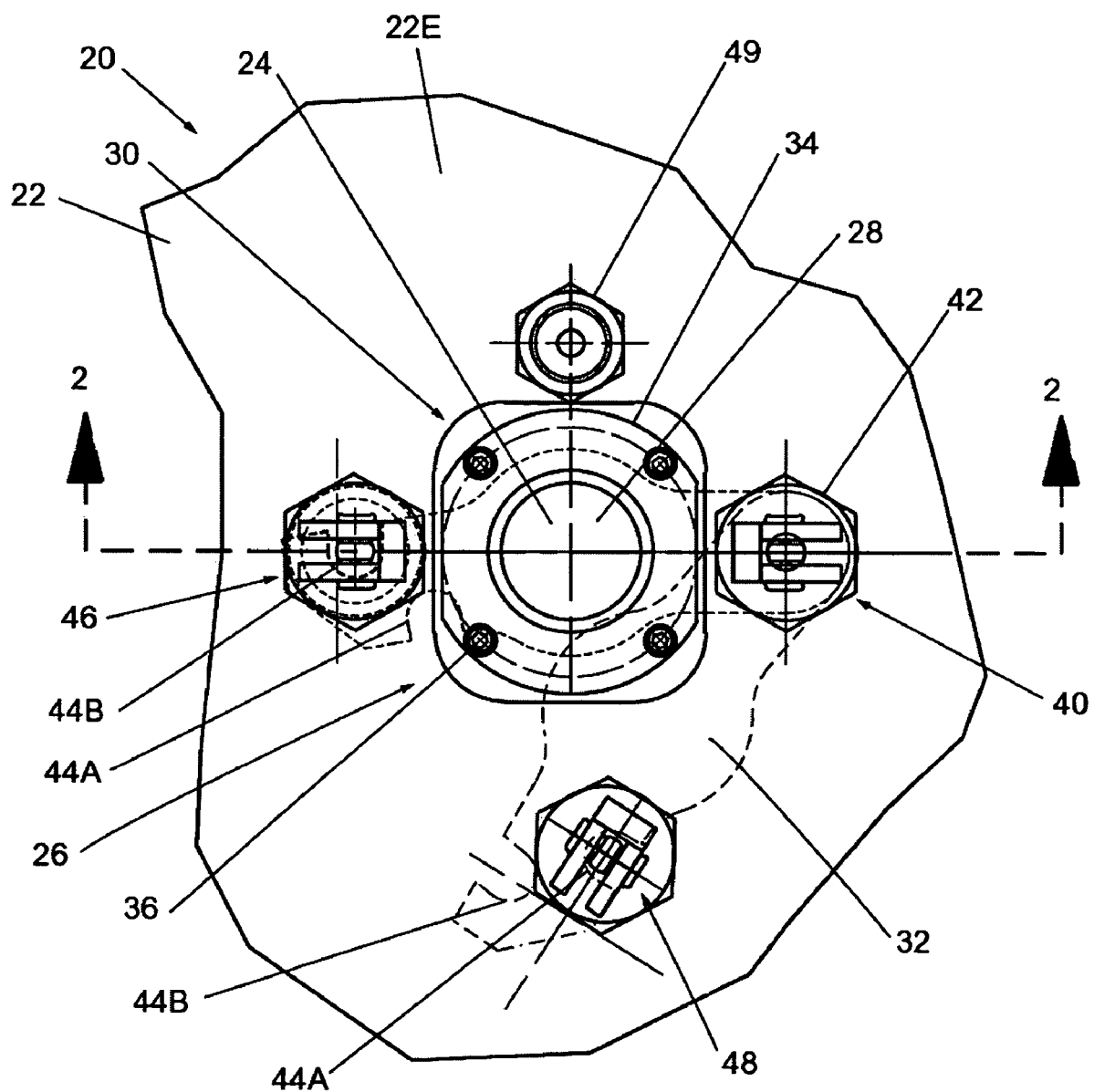
FIG. 1 is a front elevational view of a portion of a wall of a process chamber including an access assembly according to an embodiment of the present invention.

Referring now to FIGS. 1-5 which show a portion of a wall of a process chamber, a process chamber 20 includes a wall 22 (with external surface 22E) having an opening 24, an access assembly 26 comprising a window 28 covering the opening 24 to permit monitoring of the process chamber 20. For example, the window can be constructed from a material optically transparent at a desired wavelength. In the following paragraphs, although it is only made reference to the use of a "window", one of skill in the art would, however, appreciate that replacing the window by another structure is also within the scope of the present invention. For example, one may replace the window with a piece that can be used in a specific plasma process, such as a target material piece for a sputtering process.

The access assembly 26 further includes a mounting assembly 30 constructed and arranged to mount the window 28 on the wall 22, and a sealing plate 32 constructed and arranged to isolate a surface of the window 28 from a volume inside the process chamber 20.

Figure 2:
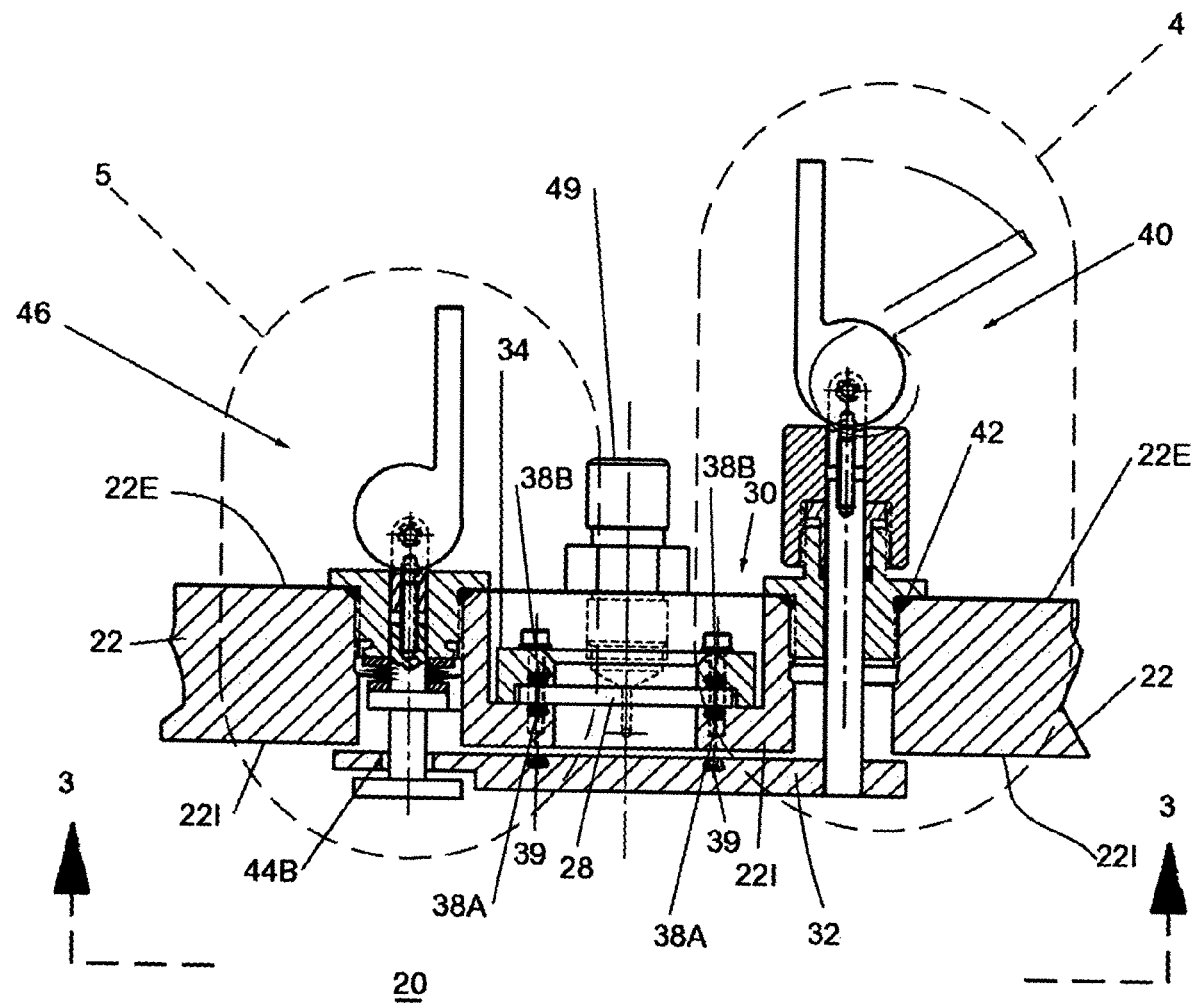
FIG. 2 is a cross-sectional view along the line 2-2 in FIG. 1.

The mounting assembly 30 comprises a window mounting ring 34. The window mounting ring 34 is secured with a number of attaching hardware devices 36, such as, for example screws. The window 28 is held in place on the wall 22 of the process chamber 20 with window mounting ring 34 and is sealed to the external surface 22E of wall 22 with O-ring 38A and is backed with O-ring 38B mounted in the window mounting ring 34 (as shown in FIG. 2).

The sealing plate 32 is pivotally mounted to the chamber wall 22 via a pivot assembly 40. The pivot assembly 40 is fixed to the wall of the process chamber with a mounting nut 42 which mates to the wall of the process chamber via a threaded hole. The sealing plate, thus pivots around an axis passing through the center of the nut 42 to open and uncover the window 28 (as indicated by the dotted-dashed line in FIG. 1) or close and cover the window 28 (as indicated by the dashed line in FIG. 1). In this regard, a device can be included to indicate the opening or closing positions of the sealing plate. Such device can comprise, for example, electromechanical systems that sense and output the translational as well as the axial position of the sealing plate.

The sealing plate 32 is provided with a sealing O-ring 39 mounted to the surface of the sealing plate 32 that mates to the internal surface 22I of wall 22 of the process chamber 20. The sealing O-ring 39 is secured in dovetail O-ring groove to ensure the O-ring remains with the sealing plate and will not become dislodged inside the chamber. Although it may not be necessary, it is also possible to provide a mating sealing surface on process chamber wall in both the open and closed positions such that to maintain the O-ring 39 inside its groove thus preventing the O-ring 39 from being dislodged.

Figure 3:
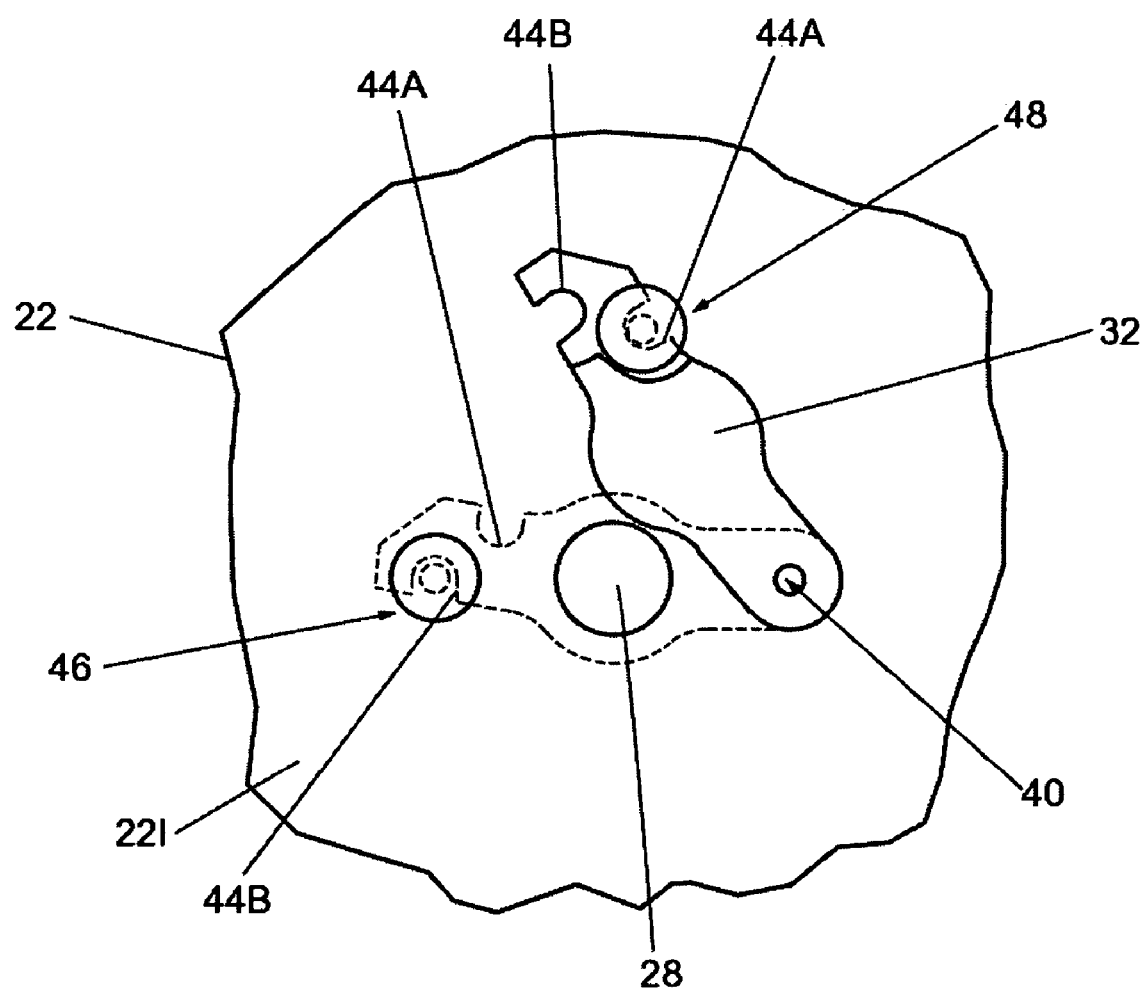
FIG. 3 is a rear elevational view along the line 3-3 in FIG. 2.

The sealing plate 32 comprises slotted receptacle features 44A and 44B that are provided to mate with retaining mechanisms 46 and 48 (as shown in FIGS. 1 and 3). The retaining mechanism 46 retains the sealing plate 32 in the closed position and the retaining mechanism 48 retains the sealing plate 32 in the open position. The slotted receptacle 44B mates with retaining mechanism 46 when the sealing plate 32 is in the closed position, i.e. covering window 28. The slotted receptacle 44A mates with retaining mechanism 48 when the sealing plate 32 is in the open position, i.e. uncovering the window 28.

When the sealing plate 32 is in the closed position, one can dismount the window 28 for maintenance or replacement without compromising the vacuum in the process chamber 20. Moreover, in the closed position, the sealing plate 32 covers the window 28, thus the window 28 is protected against accumulation of film during processing, for example, when plasma chemical reactions take place in the processing chamber.

The process chamber further includes a gas purge fitting 49 for evacuating and purging the volume between the window 28 and the sealing plate 32. The gas purge fitting 49 allows the volume to be evacuated, purged and monitored from outside the process chamber 20.

When the window 28 is dismounted, for example, for maintenance, a purging operation may be performed before opening the sealing plate 32. Specifically, after completion of such maintenance operation, and when the window 28 is mounted back and sealed against the wall 22 of the process chamber 20, the volume between the window 28 and sealing plate 32 is purged by using gas purge fitting 49. This can be accomplished, for example, by injecting gases such as, argon, via the gas purge fitting into the small volume between the sealing plate and the window to evacuate air and other particles. In this way, the operation of opening up the sealing plate 32 again would not introduce contaminants into the process chamber since only argon remains in that volume and thus the process taking place inside the process chamber would not be compromised. Alternatively, prior to opening the sealing plate 32, the volume between the sealing plate 32 and the window 28 can be evacuated by using a vacuum pump that can be connected, for example, to gas purge fitting 49. In this instance also, since this volume is evacuated from any remaining non-process contaminants, opening up the sealing plate would not introduce any foreign particles into the process chamber 20.

Figure 4:
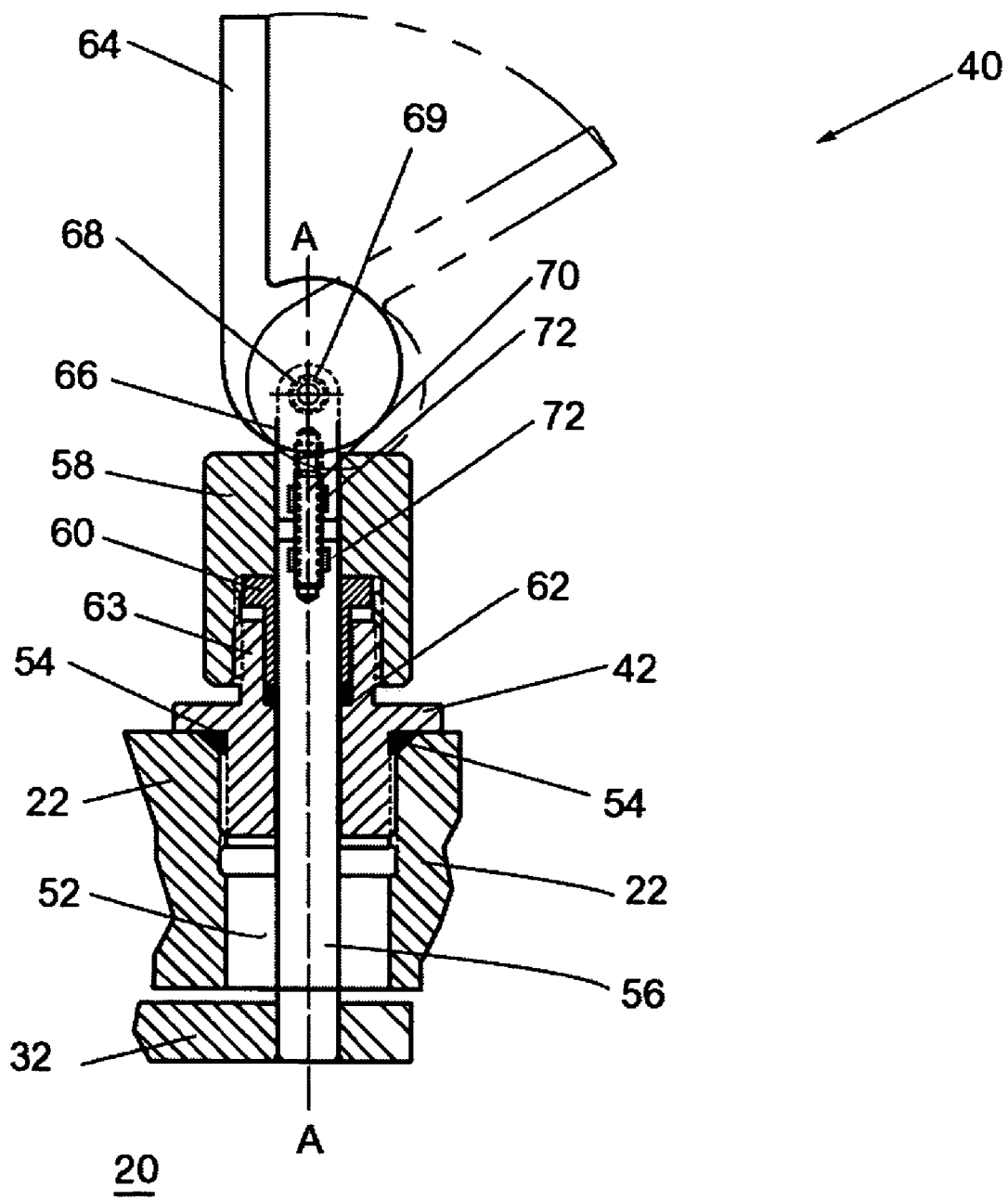
FIG. 4 is an enlarged cross-sectional view of the pivot assembly around area 4 in FIG. 2.

As shown in more detail in FIG. 4, the pivot assembly 40 is fixed to the wall 22 of the process chamber 20 with a mounting nut 42 which mates to the wall 22 of the process chamber 20 via a threaded hole 52. The mounting nut 42 seals with an O-ring 54 compressed by the head of mounting nut 42 which mates to appropriate sealing surfaces on the wall 22. The mounting nut is torqued to an appropriate value to seal with the wall 22. A lower pivot shaft 56 which is welded to the sealing plate 32 is inserted through the mounting nut 42. The mounting nut 42 is designed to be hollow around its axis so that pivot shaft 56 can be inserted through it.

A compression nut 58, a compression sleeve 60 and a radial sealing O-ring 62 are installed over the mounting nut 42. The radial O-ring 62 is placed between portion 63 of mounting nut 42 and compression sleeve 60 and around lower pivot shaft 56. At assembly the compression nut 58, which is mounted onto compression sleeve 60, is torqued to a sufficient value to press on the O-ring 62 to form a vacuum seal at the interface of the radial O-ring 62 and the lower pivot shaft 56.

An actuating lever 64 is provided to actuate the sealing plate 32. Specifically, the actuating lever 64 allows moving the sealing plate 32 axially in the direction of axis A-A as well as rotate or pivot the sealing plate 32 around axis A-A to open or close window 28 (see, for example, FIG. 3). The actuating lever 64 is attached to an upper pivot shaft 66 which in turn is attached to lower pivot shaft 56. In this embodiment, the actuating lever 64 is attached to the upper pivot shaft 66 using a dowel pin 68 backed by a screw 69. However, a shoulder bolt or other devices may also be used to attach the actuating lever 64 to the upper pivot shaft 66. The lower pivot shaft 56 and the upper pivot shaft 66 are attached with a threaded fastener, such as, for example, a setscrew 70. The use of locking elements 72 such as, for example, helical coil inserts, in both upper and lower pivot shafts allows adjusting the shaft the length between the upper and lower shafts so that the actuating lever 64 can axially move the sealing plate in the desired fashion.

Figure 5:
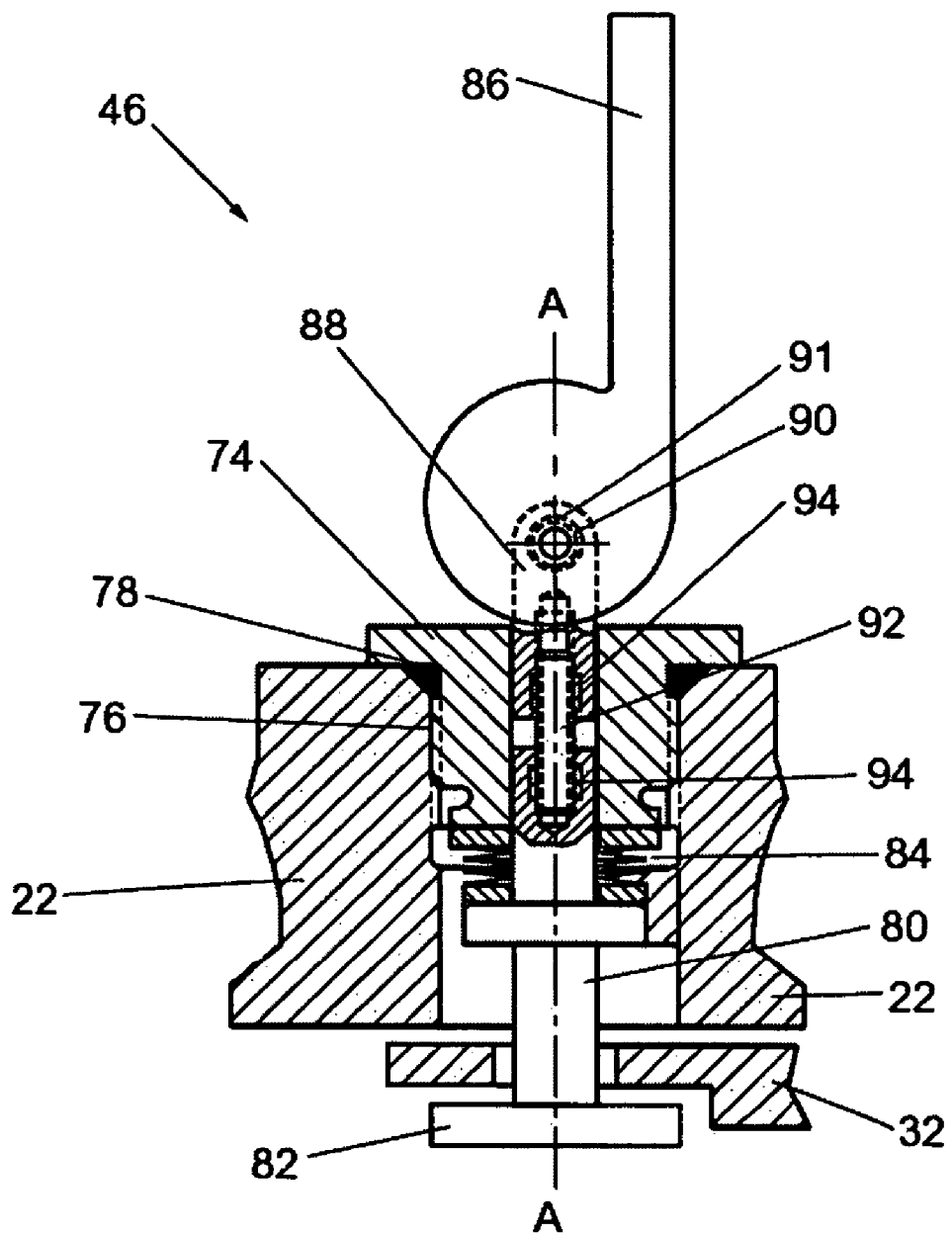
FIG. 5 is an enlarged cross-sectional view of the retaining mechanism around area 5 in FIG. 2.

As shown in more detail in FIG. 5, the retaining mechanism 46 is fixed to the wall 22 of the process chamber 20 with mounting nut 74 which mates to the wall 22 of the process chamber via a threaded hole 76. The mounting nut 74 seals with an O-ring 78 compressed by the head of mounting nut 74 which mates to appropriate sealing surfaces on the wall 22. The mounting nut 74 is torqued to an appropriate value to seal with the wall 22.

A lower retaining shaft 80 which has a headed feature 82 captures the sealing plate 32 at one of its slotted receptacle features upon actuating the retaining mechanism 46. Similarly to the mounting nut 42, the mounting nut 74 is also designed to be hollow around its axis so that lower retaining shaft 80 can be inserted through it. A metal bellows assembly 84 is welded to the retaining shaft 80. The metal bellows assembly 84 is positioned around retaining shaft 80. This bellows assembly 84 seals the retaining shaft to vacuum.

An actuating lever 86 is provided to actuate the sealing plate 32. Specifically, the actuating lever 86 allows moving the sealing plate 32 axially in the direction of axis A-A. The actuating lever 86 is attached to an upper retaining shaft 88 which in turn is attached to lower retaining shaft 80. In this embodiment, the actuating lever 86 is attached to the upper retaining shaft 88 using a dowel pin 90 backed by a screw 91. However, a shoulder bolt or other devices may also be used to attach the actuating lever 86 to the upper retaining shaft 88.

The lower retaining shaft 80 and the upper retaining shaft 88 are attached with a threaded fastener, such as, for example, a setscrew 92. The use of locking elements 94 such as, for example, helical coil inserts, in both upper and lower retaining shafts allows adjusting the shaft length between the upper retaining shaft and the lower retaining shaft so that the actuating lever 86 can axially move and retain the sealing plate 32 in the desired fashion.

Although the detailed description of the retaining mechanism is given in relation to retaining mechanism 46, one of skill in the art would appreciate that the other retaining mechanism 48 can employ a similar structure.

Figure 6:
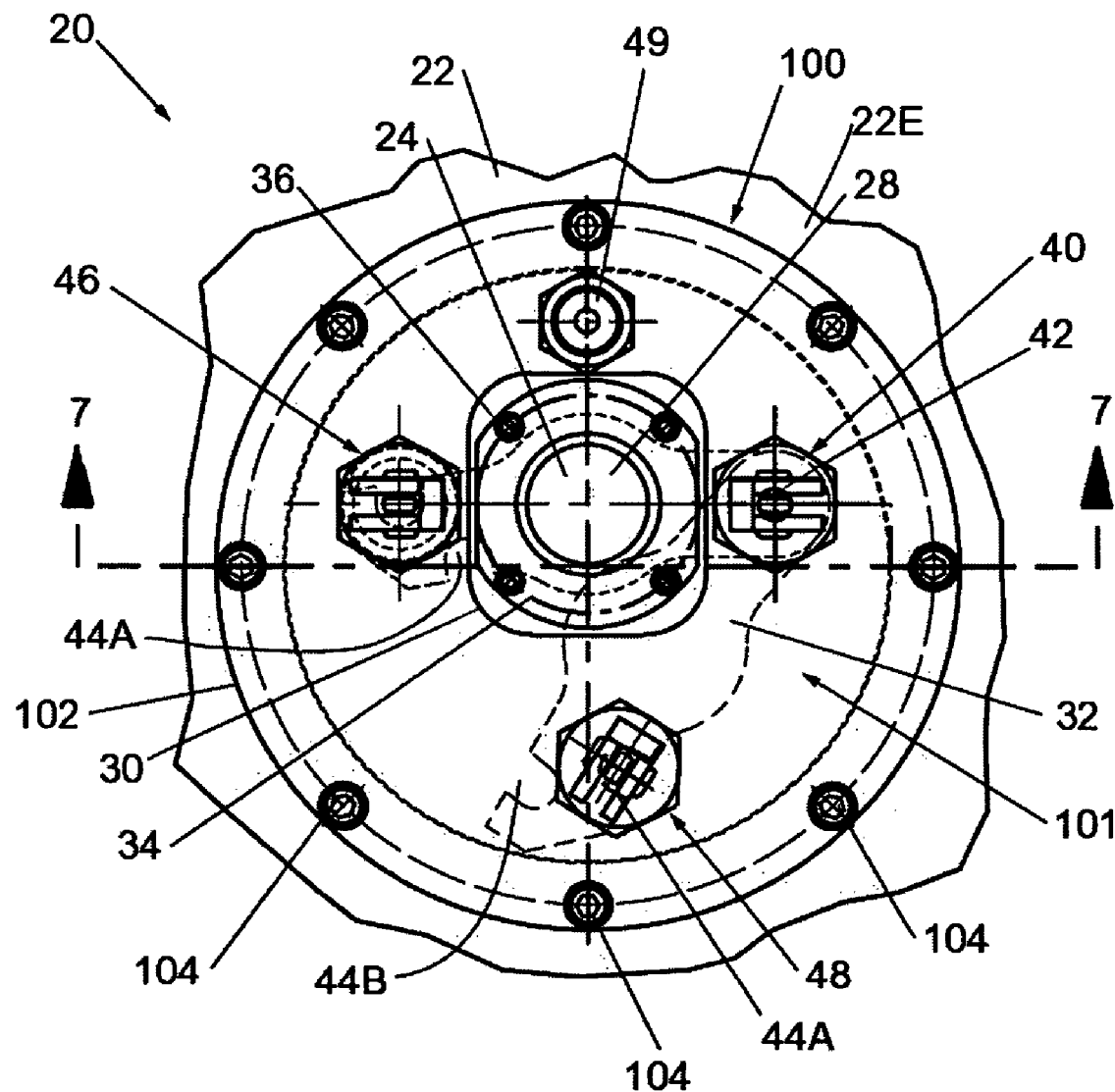
FIG. 6 is a front elevational view of a portion of a wall of a process chamber including an access assembly including a plug adapter according to another embodiment of the present invention.
Figure 7:
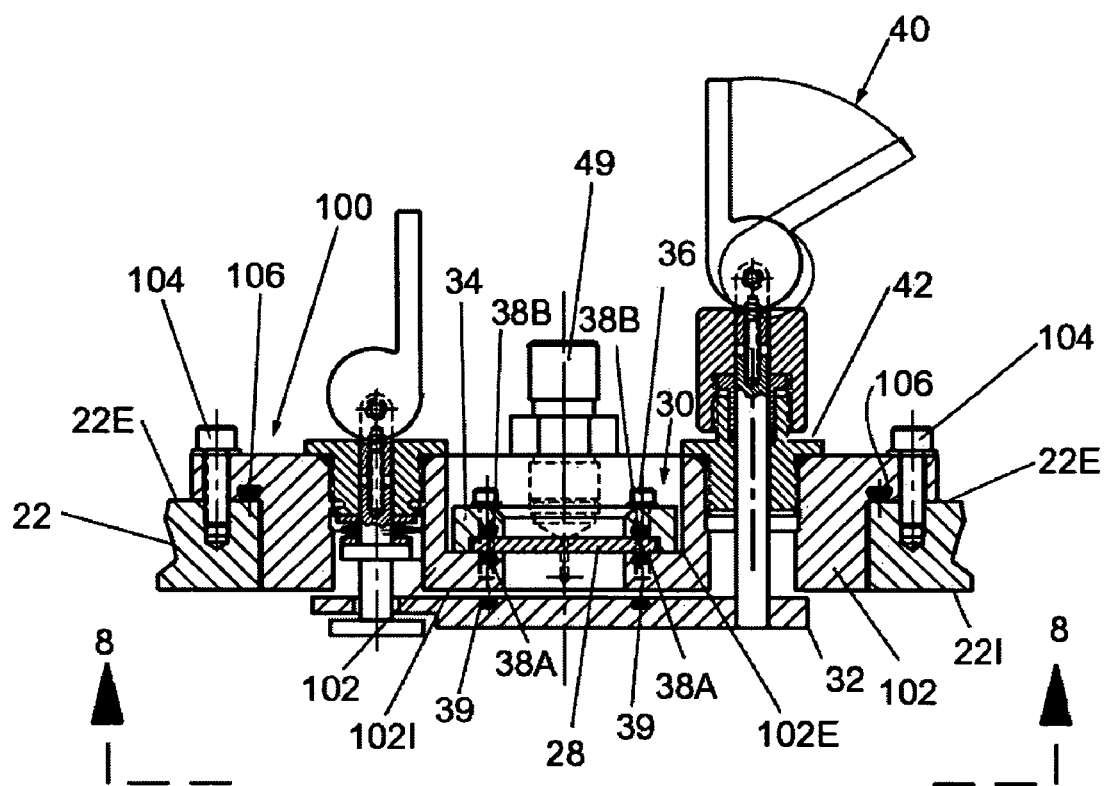
FIG. 7 is a cross-sectional view along the line 7-7 in FIG. 6.
Figure 8:
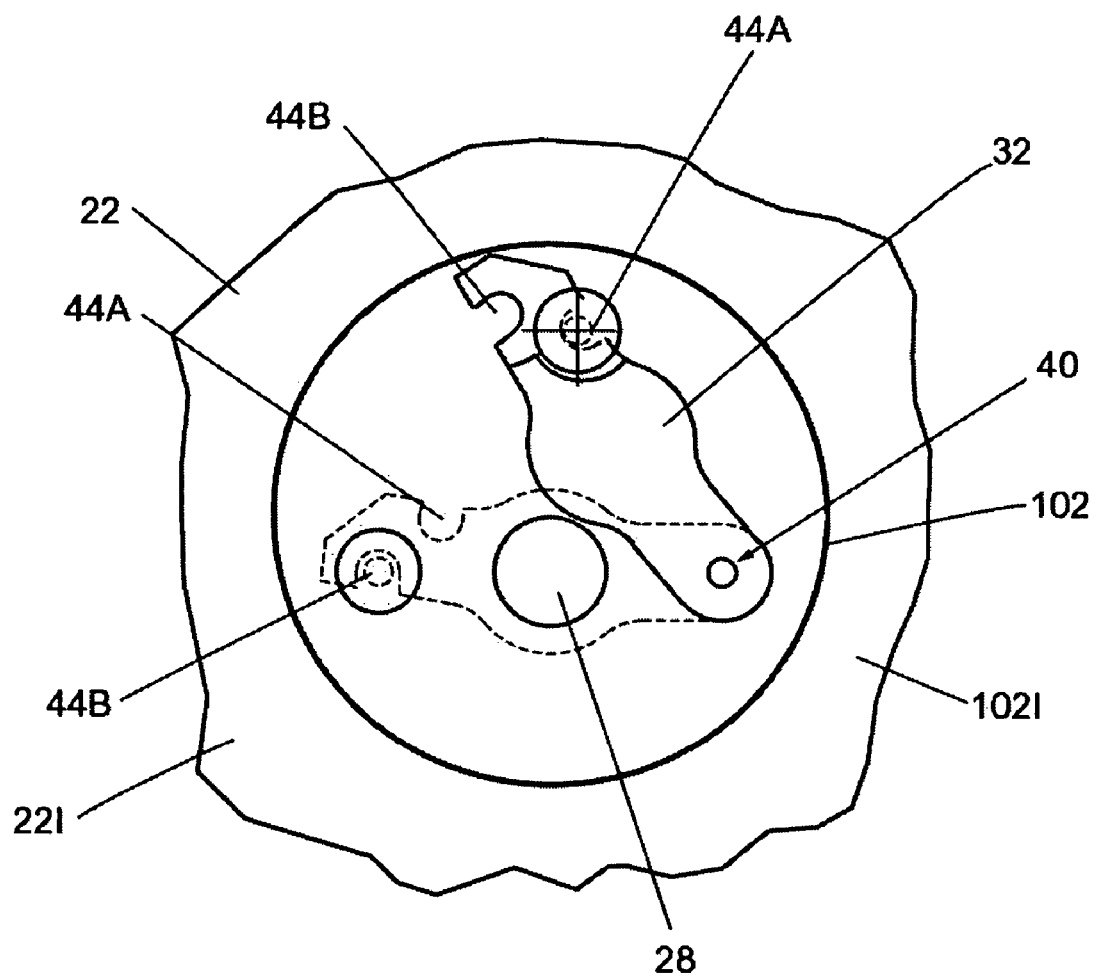
FIG. 8 is a rear elevational view along the line 8-8 in FIG. 7.

FIGS. 6-8 show various views of a portion of a wall of a process chamber including an access assembly 100 comprising a plug adapter 102 according to another embodiment of the present invention. The process chamber 20 includes a wall 22 (with external surface 22E) having an opening 101. The plug adapter 102 is mounted to the wall 22 of process chamber 20 in order to seal opening 101 in the wall 22 of process chamber 20. The plug adapter 102 is held in place by using a plurality of attachments 104. The attachments 104 can be, for example, distributed around plug adapter 102 and an O-ring 106 (shown in FIG. 7) is used to seal the plug adapter 102 to external surface 22E of process chamber wall 22.

The access assembly 100 further includes a mounting assembly 30 for sealingly mounting window 28 to plug adapter 102. The plug adapter 102 has an opening 24 and window 28 covers the opening 24. The access assembly 100 further includes a sealing plate 32 constructed and arranged to isolate a surface of the window 28 from a volume inside the process chamber 20.

The use of a plug adapter for mounting the window instead of mounting the window directly on the wall of the process chamber allows, for example, adapting the same access assembly for use in various process chambers. For example, the access assembly with the plug adapter can be mass manufactured for use in various process chambers. In this case, mounting the access assembly to the process chamber requires simply mounting the plug adapter to the process chamber. Therefore, this feature provides greater flexibility as well as time and cost savings.

The mounting assembly 30 comprises a window mounting ring 34. The window mounting ring 34 is secured with a number of attaching hardware devices 36, such as, for example screws. The mounting assembly 30 further comprises a pair of O-rings 38A and 38B (shown in FIG. 7) to seal the window 28 to plug adapter 102 and to cushion the window to the mounting ring 34, respectively. The window 28 is sealed to the external surface 102E of plug adapter 102 with O-ring 38A and is backed with O-ring 38B mounted in the window mounting ring 34.

The sealing plate 32 is provided with a sealing O-ring 39 mounted to the surface of the sealing plate 32 that mates to the internal surface 102I of plug adapter 102. The internal surface 102I of plug adapter 102 and the internal surface 22I of process chamber wall 22 share the same plane level, in the embodiment shown.

The sealing plate 32 is pivotally mounted to the plug adapter 102 via a pivot assembly 40. The pivot assembly 40 is fixed to plug adapter 102 with a mounting nut 42 which mates to the plug adapter 102 via a threaded hole. The sealing plate 32, thus pivots around an axis passing through the center of the nut 42 to open and uncover the window 28 (as indicated by the dotted-dashed line in FIG. 6) or close and cover the window 28 (as indicated by the dashed line in FIG. 6).

Similarly to the embodiment shown in FIGS. 1-5, the sealing plate 32 comprises slotted receptacle features 44A and 44B that are provided to mate with retaining mechanisms 46 and 48. The retaining mechanism 46 retains the sealing plate 32 in the closed position and the retaining mechanism 48 retains the sealing plate 32 in the open position.

The retaining mechanisms 46 and 48 are provided with the respective mating slotted receptacle features 44B and 44A. The slotted receptacle 44B mates with retaining mechanism 46 when the sealing plate 32 is in the closed position, i.e. covering window 28. The slotted receptacle 44A mates with retaining mechanism 48 when the sealing plate 32 is in the open position, i.e. uncovering the window 28.

The process chamber further includes a gas purge fitting 49 for evacuating and purging the volume between the window 28 and the sealing plate 32. The gas purge fitting 49 is mounted on plug adapter 102. The gas purge fitting 49 allows the volume to be evacuated, purged and monitored from outside the process chamber 20. For example, after maintenance operations are completed and the sealing plate 32 returns to the open position, the process will not be compromised by a small volume of non-process contaminants.

Figure 9:
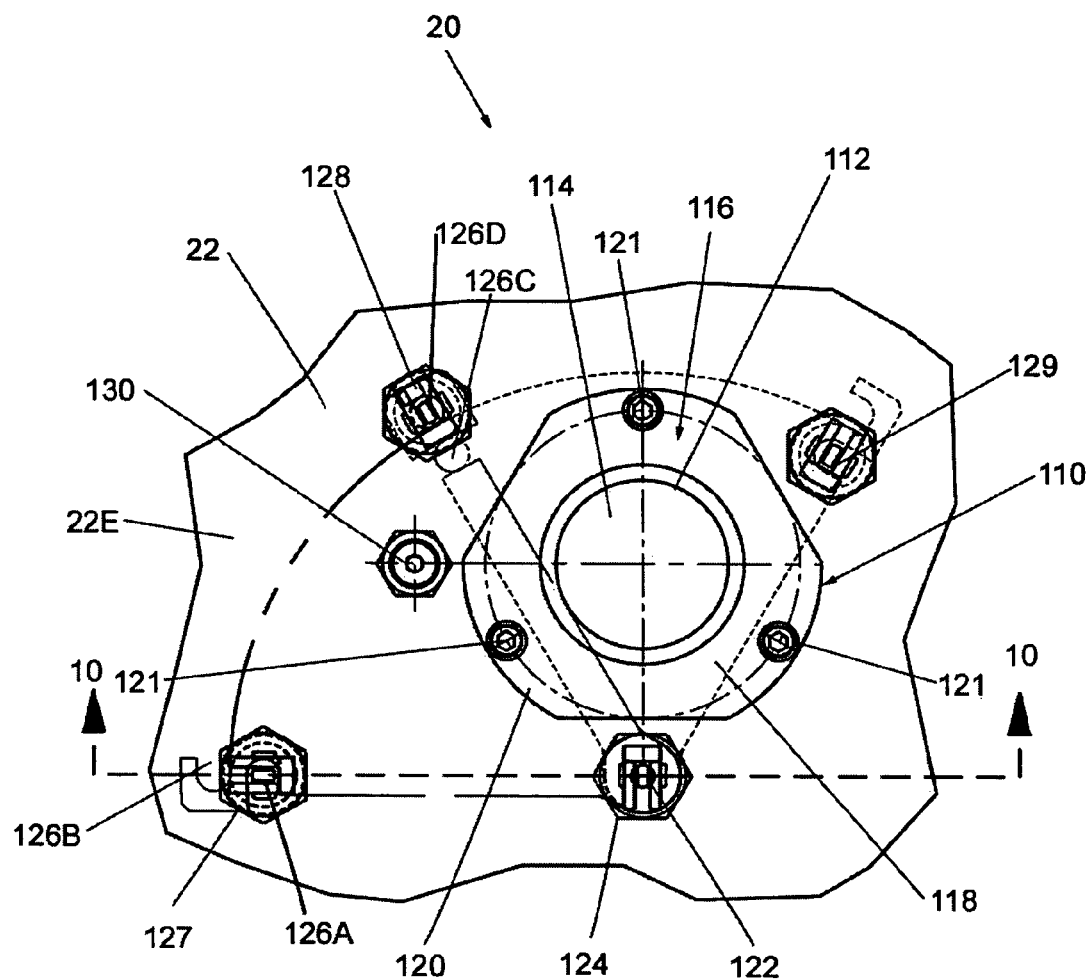
FIG. 9 is a front elevational view of a portion of a wall of a process chamber including a relatively large access assembly according to yet another embodiment of the present invention.
Figure 10:
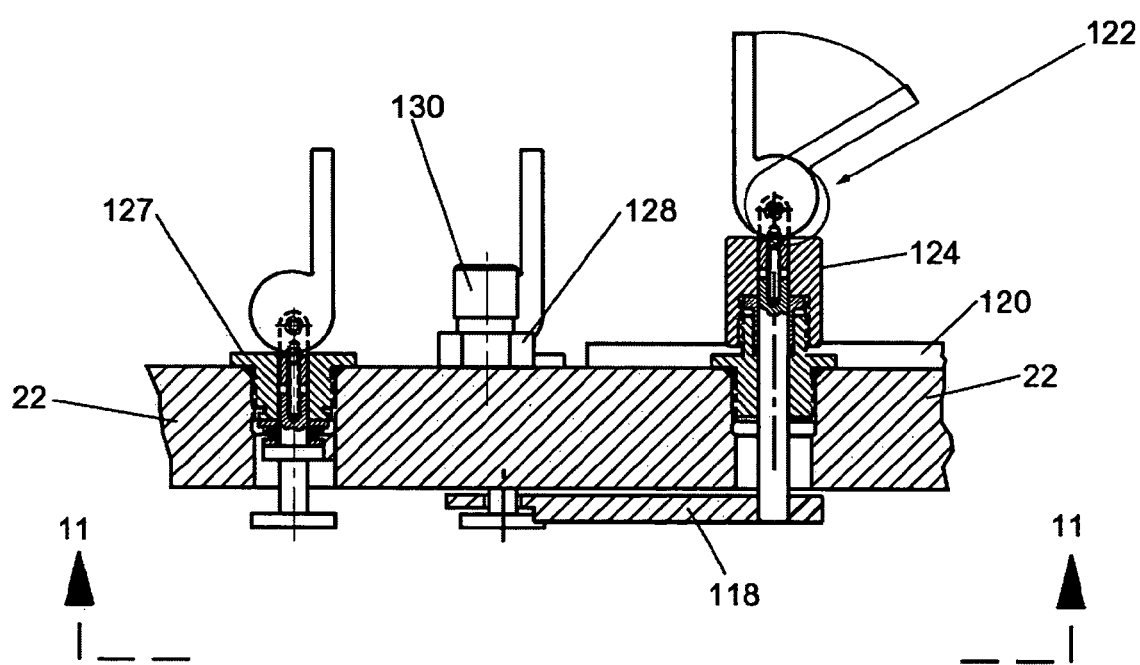
FIG. 10 is a cross-sectional view along the line 10-10 in FIG. 9.
Figure 11:
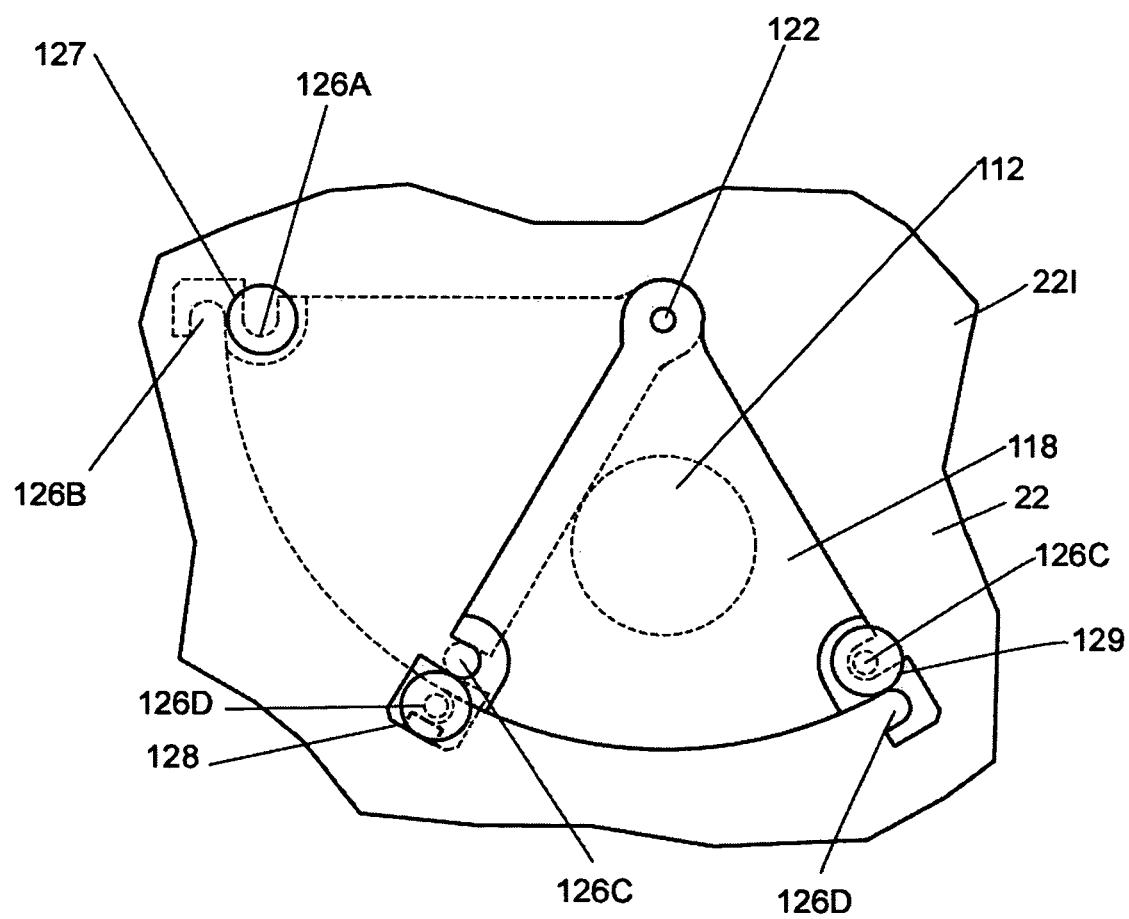
FIG. 11 is a rear elevational view along the line 11-11 in FIG. 10.

FIGS. 9-11 show various views of a portion of a wall of a process chamber including a relatively large access assembly according to yet another embodiment of the present invention. Access assembly 110 comprises a relatively large window 112 covering the opening 114 to permit monitoring of the process chamber 20. In this embodiment, the window 112, for example, has a diameter larger than the window 28 shown in the previous embodiments. The access assembly 110 further includes a mounting assembly 116 constructed and arranged to mount the window 112 on the wall 22, and a sealing plate 118 constructed and arranged to isolate a surface of the window 112 from a volume inside the process chamber 20.

The mounting assembly 116 comprises a window mounting ring 120. The window mounting ring 120 is secured with a number of attaching hardware devices 121, such as, for example screws. The mounting assembly 116 further comprises a pair of O-rings (not shown) to seal the window 112 to wall 22 and to window mounting ring 120, respectively.

The sealing plate 118 is pivotally mounted to the chamber wall 22 via a pivot assembly 122. The pivot assembly 122 is fixed to the wall of the process chamber with a mounting nut 124 which mates to the wall of the process chamber via a threaded hole. The sealing plate, thus pivots around an axis passing through the center of the nut 42 to open and uncover the window 112 or close and cover the window 112.

The sealing plate 118 comprises slotted receptacle features 126A, 126B, 126C and 126D that are provided to mate with retaining mechanisms 127, 128 and 129. In this embodiment, the sealing plate 118 has a sector-like shape. However, one of skill in the art would appreciate that other geometrical shapes are also within the scope of the present invention. The retaining mechanisms 127 and 128 retain the sealing plate 118 in the open position and the retaining mechanism 128 and 129 retain the sealing plate 118 in the closed position.

The slotted receptacle 126A mates with retaining mechanism 127 and the slotted receptacle 126D mates with retaining mechanism 128 when the sealing plate 118 is in the open position, i.e. uncovering window 112 (illustrated with a dotted line in FIG. 11). The slotted receptacle 126B mates with retaining mechanism 128 and the slotted receptacle 126C mates with retaining mechanism 129 when the sealing plate 118 is in the closed position, i.e. covering the window 112 (illustrated with a solid line in FIG. 11).

The process chamber further includes a gas purge fitting 130 for evacuating and purging the volume between the window 112 and the sealing plate 118. The gas purge fitting 130 allows the volume to be evacuated, purged and monitored from outside the process chamber 20. For example, after maintenance operations are completed and the sealing plate 118 returns to the open position, the process will not be compromised by a small volume of non-process contaminants.

The sealing plate 118 pivots around an axis passing through the center of the pivot assembly 122 to open and uncover the window 112 or close and cover the window 112. The construction of pivot assembly 122 is similar to the construction of pivot assembly 40 described above. The construction of retaining mechanisms 127 and 128 is also similar to the retaining mechanism 46. However, other designs and configurations of the pivot assembly and retaining mechanisms are also within the scope of the present invention.

Although the sealing plate is shown in the Figures being actuated via a lever actuated by hand, one of ordinary skill in the art would appreciate that, for example, motors, springs, pneumatic devices or magnets can be utilized to perform or aid in the actuation of the sealing plate. Similarly, although the window and the sealing plate are shown having certain forms, for example the window having a disk form, other geometrical forms are also within the scope of the present invention. The many features and advantages of the present invention are apparent from the detailed specification and thus, it is intended by the appended claims to cover all such features and advantages of the described apparatus which follow the true spirit and scope of the invention.

Furthermore, since numerous modifications and changes will readily occur to those of skill in the art, it is not desired to limit the invention to the exact construction and operation described herein. Moreover, the process and apparatus of the present invention, like related apparatus and processes used in the vacuum technology tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed:

1. An access assembly for a process chamber, comprising:
   a segment of a wall of said process chamber;
   a mounting assembly constructed and arranged to couple said segment to said process chamber, wherein said mounting assembly comprises a mounting ring;
   a sealing plate mounted to the inside of said process chamber;
   a plurality of attachment devices to secure said mounting ring to said process chamber;
   a pivot assembly mounting said sealing plate to said wall of said process chamber;
   a sealing O-ring mounted to a surface of the sealing plate that mates to an internal surface of the wall of said process chamber,
   wherein said sealing plate is constructed and arranged to selectively seal said segment from a volume inside said process chamber.

2. The access assembly for a process chamber as recited in claim 1, wherein said segment is a window constructed and arranged to optically access said process chamber.

3. The access assembly for a process chamber as recited in claim 2, wherein said window is constructed from a material that is optically transparent at a desired wavelength of radiation.

4. The access assembly for a process chamber as recited in claim 1, further comprising a mounting nut fixing said pivot assembly to the wall of said process chamber, said pivot assembly comprising a pivot shaft.

5. The access assembly for a process chamber as recited in claim 4,
   wherein said mounting nut mates to the wall of said process chamber via a threaded hole, said port further comprising an O-ring compressed by a head of the mounting nut to seal said mounting nut.

6. The access assembly for a process chamber as recited in claim 4,
   wherein said mounting nut is torqued to seal with said wall of said process chamber.

7. The access assembly for a process chamber as recited in claim 6,
   wherein said mounting nut comprises a hollow portion.

8. The access assembly for a process chamber as recited in claim 4,
   wherein said pivot assembly further comprises a compression nut, a compression sleeve and a radial sealing O-ring installed over said mounting nut.

9. The access assembly for a process chamber as recited in claim 8,
   wherein said radial O-ring is placed between a portion of said mounting nut and said compression sleeve and around a lower portion of said pivot shaft.

10. The access assembly for a process chamber as recited in claim 9,
    wherein said compression nut which is mounted onto the compression sleeve is torqued to press on said radial O-ring to form a vacuum seal at an interface of the radial O-ring and said lower portion of said pivot shaft.

11. The access assembly for a process chamber as recited in claim 4,
    wherein said pivot assembly further comprises an actuating lever constructed and arranged to actuate said sealing plate.

12. The access assembly for a process chamber as recited in claim 11,
    wherein said actuating lever is constructed and arranged to move said sealing plate in a direction of an axis parallel to said pivot shaft.

13. The access assembly for a process chamber as recited in claim 11,
    wherein said actuating lever is constructed and arranged to rotate said sealing plate around an axis parallel to said pivot shaft.

14. The access assembly for a process chamber as recited in claim 11,
    wherein said actuating lever is attached to an upper portion of said pivot shaft.

15. The access assembly for a process chamber as recited in claim 14,
    wherein said upper portion of said pivot shaft is attached to a lower portion of said pivot shaft via a threaded fastener.

16. The access assembly for a process chamber as recited in claim 15,
    wherein said threaded fastener comprises a screw.

17. The access assembly for a process chamber as recited in claim 15, wherein said upper portion and said lower portion of the pivot shaft comprise a locking element constructed and arranged to adjust a length between the upper and lower portion of the pivot shaft.

18. The access assembly for a process chamber as recited in claim 1, further comprising:
a retaining mechanism to retain said sealing plate, said retaining mechanism comprising a retaining shaft.

19. The access assembly for a process chamber as recited in claim 18,
wherein a lower portion of said retaining shaft is terminated by a headed feature constructed and arranged to capture said sealing plate.

20. The access assembly for a process chamber as recited in claim 18, further comprising:
a mounting nut to mate the retaining shaft to the wall of said process chamber via a threaded hole; and
an O-ring compressed by a head of the mounting nut to seal the mounting nut.

21. The access assembly for a process chamber as recited in claim 20,
wherein said mounting nut is torqued to seal with said wall of said process chamber.

22. The access assembly for a process chamber as recited in claim 18,
wherein said mounting nut comprises a hollow portion and a lower portion of said retaining shaft is inserted through said hollow portion.

23. The access assembly for a process chamber as recited in claim 22, further comprising a metal bellows assembly coupled to said lower portion of said retaining shaft.

24. The access assembly for a process chamber as recited in claim 23,
wherein said metal bellows assembly is positioned around said lower portion of said retaining shaft and said metal bellows assembly seals said lower portion of said retaining shaft to vacuum.

25. The access assembly for a process chamber as recited in claim 18,
wherein said retaining mechanism further comprises an actuating lever constructed and arranged to actuate said sealing plate.

26. The access assembly for a process chamber as recited in claim 25,
wherein said actuating lever is attached to an upper portion of said retaining shaft.

27. The access assembly for a process chamber as recited in claim 25, further comprising a threaded fastener attaching said upper portion of said retaining shaft to said lower portion of said retaining shaft.

28. The access assembly for a process chamber as recited in claim 27,
wherein said threaded fastener comprises a setscrew.

29. The access assembly for a process chamber as recited in claim 27,
wherein said retaining shaft comprises a locking element constructed and arranged to adjust a length between said upper and lower portions of said retaining shaft.

30. The access assembly for a process chamber as recited in claim 1, further comprising:
a retaining mechanism fixed to the wall of said process chamber,
wherein said sealing plate comprises at least one slotted receptacle feature, said slotted receptacle feature being configured to mate with said retaining mechanism.

31. The access assembly for a process chamber as recited in claim 1, further comprising a first and a second retaining mechanism fixed to the wall of said process chamber,
wherein said sealing plate comprises a first slotted receptacle feature adapted to mate with said first retaining mechanism to retain said sealing plate in a closed position, and a second slotted receptacle feature adapted to mate with said second retaining mechanism to retain said sealing plate in an open position.

32. The access assembly for a process chamber as recited in claim 31,
wherein when said sealing plate is in the closed position said segment is covered by said sealing plate and when said sealing plate is in the open position said segment is uncovered by said sealing plate.

33. The access assembly for a process chamber as recited in claim 1, further comprising a gas purge fitting constructed and arranged to purge a volume between said sealing plate and said segment with a gas.

34. The access assembly for a process chamber as recited in claim 1, further comprising a gas purge fitting constructed and arranged to evacuate a volume between said sealing plate and said segment with a vacuum pump.

* * * * *